US 9,628,109 B1

United States Patent
Abali et al.

(10) Patent No.: US 9,628,109 B1
(45) Date of Patent: Apr. 18, 2017

(54) OPERATION OF A MULTI-SLICE PROCESSOR IMPLEMENTING PRIORITY ENCODING OF DATA PATTERN MATCHES

(71) Applicant: International Business Machines Corporation, Armonk, NY (US)

(72) Inventors: Bulent Abali, Tenafly, NJ (US); Bartholomew Blaner, Underhill Center, VT (US); John J. Reilly, Huntington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/195,140

(22) Filed: Jun. 28, 2016

(51) Int. Cl.
  *H03M 7/34* (2006.01)
  *H03M 7/30* (2006.01)

(52) U.S. Cl.
  CPC .................. *H03M 7/3084* (2013.01)

(58) Field of Classification Search
  CPC .................................... H03M 7/3084
  USPC ........................... 341/51, 87, 106
  See application file for complete search history.

(56) References Cited

U.S. PATENT DOCUMENTS

| | | | |
|---|---|---|---|
| 6,392,567 B2 * | 5/2002 | Satoh | H03M 7/3086 341/51 |
| 6,535,642 B1 | 3/2003 | De Bonet | |
| 6,771,193 B2 | 8/2004 | Craft | |
| 7,650,040 B2 | 1/2010 | Ghildiyal | |
| 8,013,762 B2 | 9/2011 | Matthews, Jr. et al. | |
| 8,044,829 B2 * | 10/2011 | Chen | H03M 7/48 341/51 |

* cited by examiner

*Primary Examiner* — Khai M Nguyen
(74) *Attorney, Agent, or Firm* — Brandon C. Kennedy; Robert R. Williams; Kennedy Lenart Spraggins LLP (57) ABSTRACT

Operation of a multi-slice computer processor that includes a plurality of execution slices. Operation of such a computer processor includes: matching one or more sub strings of a data string to one or more substrings of a data set; determining that a particular substring of the one or more substrings of the data string corresponds to a highest priority value among one or more priority values mapped to one or more encodings for the one or more substrings of the data string; and encoding, in dependence upon the particular substring of the data string corresponding to the highest priority value, the data string into an encoding that encodes the particular substring of the one or more substrings of the data string.

20 Claims, 7 Drawing Sheets

OPERATION OF A MULTI-SLICE PROCESSOR IMPLEMENTING PRIORITY ENCODING OF DATA PATTERN MATCHES

BACKGROUND

Field of the Invention

The field of the invention is data processing, or, more specifically, methods and apparatus for operation of a multi-slice processor.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One area of computer system technology that has advanced is computer processors. As the number of computer systems in data centers and the number of mobile computing devices has increased, the need for more efficient computer processors has also increased. Speed of operation and power consumption are just two areas of computer processor technology that affect efficiency of computer processors. Further, as larger amounts of data are managed, encoding techniques have been developed to compress the size of data streams.

SUMMARY

Methods and apparatus for operation of a multi-slice computer processor are disclosed in this specification. Such a multi-slice computer processor includes a plurality of execution slices and a plurality of load/store slices, where the load/store slices are coupled to the execution slices via a results bus. Operation of such a computer processor includes: matching one or more substrings of a data string to one or more substrings of a data set; determining that a particular substring of the one or more substrings of the data string corresponds to a highest priority value among one or more priority values mapped to one or more encodings for the one or more substrings of the data string; and encoding, in dependence upon the particular substring of the data string corresponding to the highest priority value, the data string into an encoding that encodes the particular substring of the one or more substrings of the data string.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
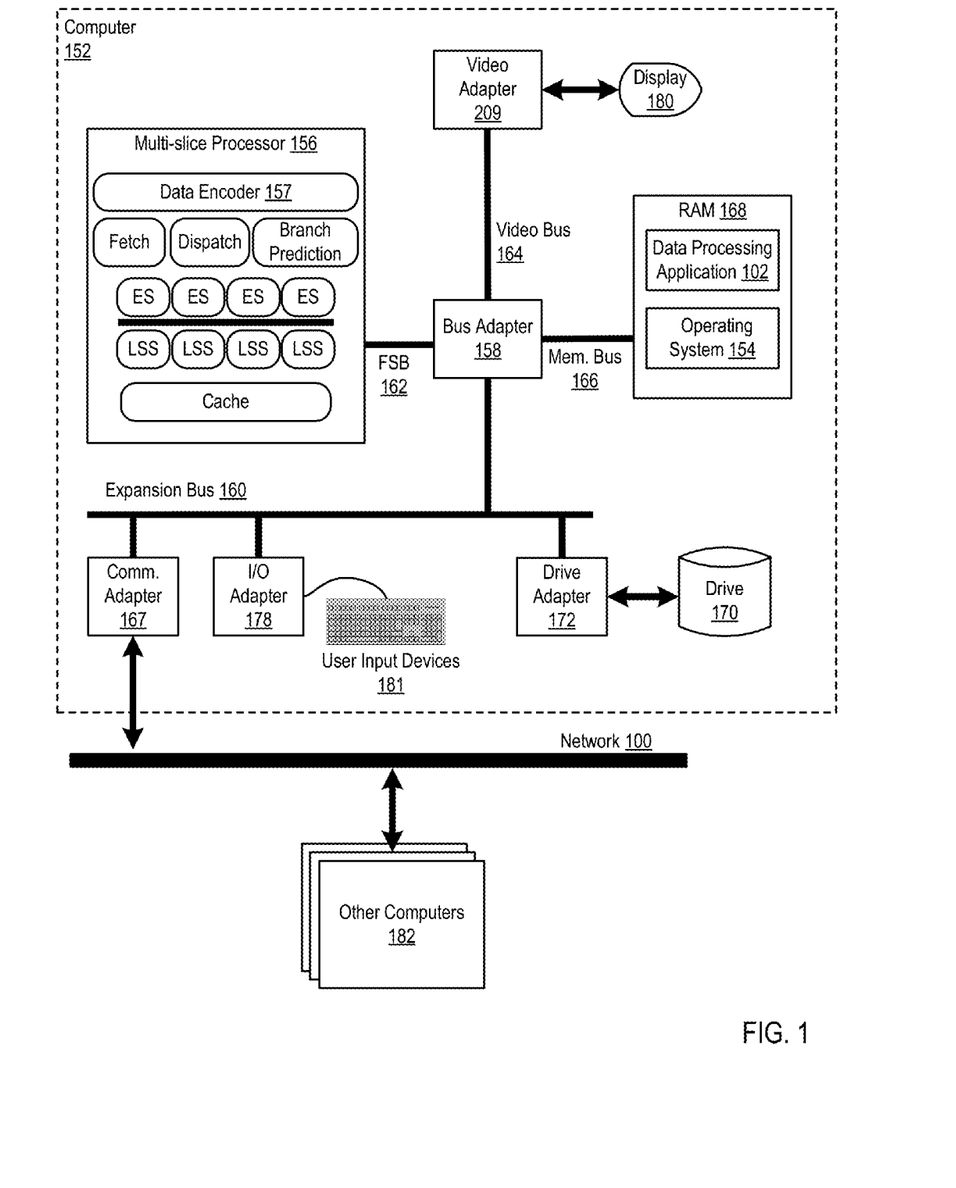
FIG. 1 sets forth a block diagram of an example system configured for operation of a multi-slice processor according to embodiments of the present invention.

Exemplary methods and apparatus for operation of a multi-slice processor in accordance with the present invention are described with reference to the accompanying drawings, beginning with FIG. 1. FIG. 1 sets forth a block diagram of an example system configured for operation of a multi-slice processor according to embodiments of the present invention. The system of FIG. 1 includes an example of automated computing machinery in the form of a computer (152). Further, the multi-slice processor includes data encoder (157) logic that may be configured to implement priority encoding of data pattern matches to encode a number of bytes in a data stream into a smaller number of bytes.

The computer (152) of FIG. 1 includes at least one computer processor (156) or 'CPU' as well as random access memory (168) (RAM') which is connected through a high speed memory bus (166) and bus adapter (158) to processor (156) and to other components of the computer (152).

The example computer processor (156) of FIG. 1 may be implemented as a multi-slice processor. The term 'multi-slice' as used in this specification refers to a processor having a plurality of similar or identical sets of components, where each set may operate independently of all the other sets or in concert with the one or more of the other sets. The multi-slice processor (156) of FIG. 1, for example, includes several execution slices ('ES') and several load/store slices ('LSS')—where load/store slices may generally be referred to as load/store units. Each execution slice may be configured to provide components that support execution of instructions: an issue queue, general purpose registers, a history buffer, an arithmetic logic unit (including a vector scalar unit, a floating point unit, and others), and the like. Each of the load/store slices may be configured with components that support data movement operations such as loading of data from cache or memory or storing data in cache or memory. In some embodiments, each of the load/store slices includes a data cache. The load/store slices are coupled to the execution slices through a results bus. In some embodiments, each execution slice may be associated with a single load/store slice to form a single processor slice. In some embodiments, multiple processor slices may be configured to operate together.

The example multi-slice processor (156) of FIG. 1 may also include, in addition to the execution and load/store slices, other processor components. In the system of FIG. 1, the multi-slice processor (156) includes fetch logic, dispatch logic, and branch prediction logic. Further, although in some embodiments each load/store slice includes cache memory, the multi-slice processor (156) may also include cache accessible by any or all of the processor slices.

Although the multi-slice processor (156) in the example of FIG. 1 is shown to be coupled to RAM (168) through a front side bus (162), a bus adapter (158) and a high speed memory bus (166), readers of skill in the art will recognize that such configuration is only an example implementation. In fact, the multi-slice processor (156) may be coupled to other components of a computer system in a variety of configurations. For example, the multi-slice processor (156) in some embodiments may include a memory controller configured for direct coupling to a memory bus (166). In some embodiments, the multi-slice processor (156) may support direct peripheral connections, such as PCIe connections and the like.

Stored in RAM (168) in the example computer (152) is a data processing application (102), a module of computer program instructions that when executed by the multi-slice processor (156) may provide any number of data processing tasks. Examples of such data processing applications may include a word processing application, a spreadsheet application, a database management application, a media library application, a web server application, and so on as will occur to readers of skill in the art. Also stored in RAM (168) is an operating system (154). Operating systems useful in computers configured for operation of a multi-slice processor according to embodiments of the present invention include UNIX™, Linux™, Microsoft Windows™, AIX™, IBM's z/OS™, and others as will occur to those of skill in the art. The operating system (154) and data processing application (102) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers configured for operation of a multi-slice processor according to embodiments of the present invention include Integrated Drive Electronics ('IDE') adapters, Small Computer System Interface (SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for operation of a multi-slice processor according to embodiments of the present invention include modems for wired dial-up communications, Ethernet (IEEE 802.3) adapters for wired data communications, and 802.11 adapters for wireless data communications.

The arrangement of computers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
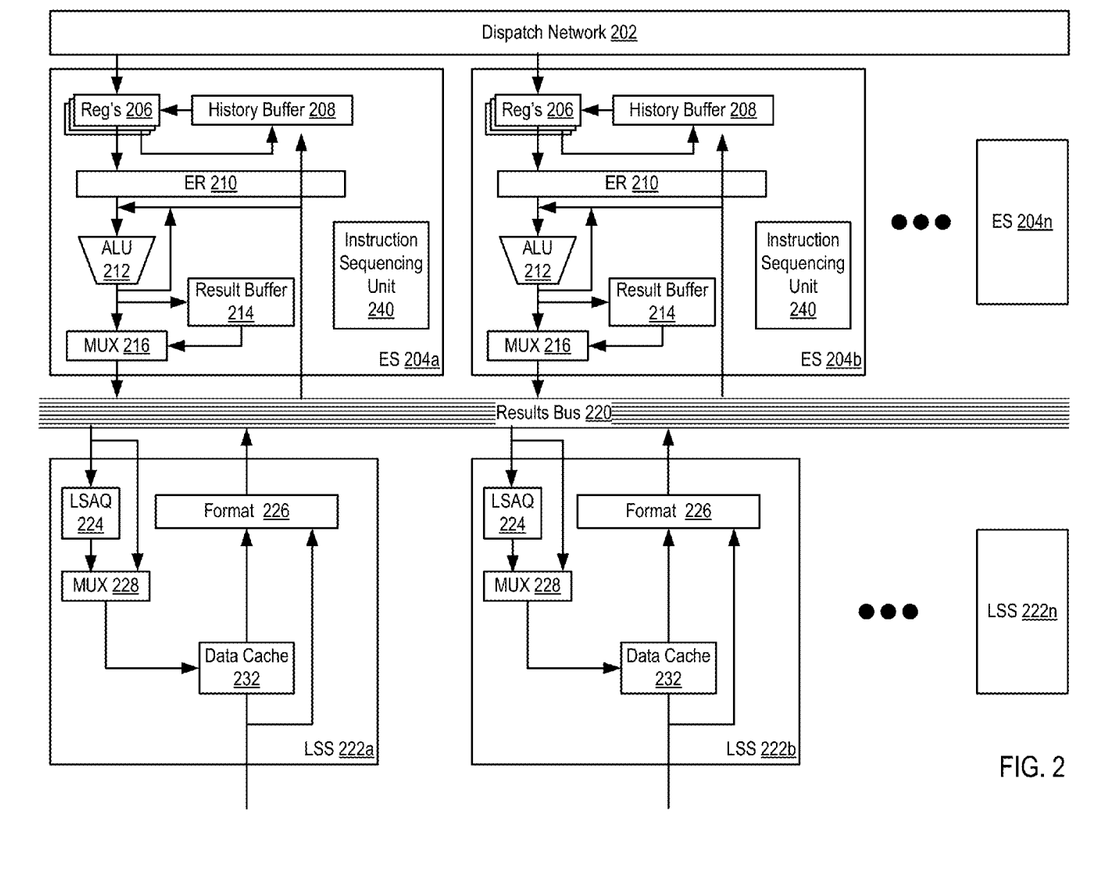
FIG. 2 sets forth a block diagram of a portion of a multi-slice processor according to embodiments of the present invention.

For further explanation, FIG. 2 sets forth a block diagram of a portion of a multi-slice processor according to embodiments of the present invention. The multi-slice processor in the example of FIG. 2 includes a dispatch network (202). The dispatch network (202) includes logic configured to dispatch instructions for execution among execution slices.

The multi-slice processor in the example of FIG. 2 also includes a number of execution slices (204a, 204b-204n). Each execution slice includes general purpose registers (206) and a history buffer (208). The general purpose registers and history buffer may sometimes be referred to as the mapping facility, as the registers are utilized for register renaming and support logical registers.

The general purpose registers (206) are configured to store the youngest instruction targeting a particular logical register and the result of the execution of the instruction. A logical register is an abstraction of a physical register that enables out-of-order execution of instructions that target the same logical register.

When a younger instruction targeting the same particular logical register is received, the entry in the general purpose register is moved to the history buffer, and the entry in the general purpose register is replaced by the younger instruction. The history buffer (208) may be configured to store many instructions targeting the same logical register. That is, the general purpose register is generally configured to store a single, youngest instruction for each logical register while the history buffer may store many, non-youngest instructions for each logical register.

Each execution slice (204) of the multi-slice processor of FIG. 2 also includes an execution reservation station (210).

The execution reservation station (210) may be configured to issue instructions for execution. The execution reservation station (210) may include an issue queue. The issue queue may include an entry for each operand of an instruction. The issue queue may also include a single entry per single instruction, where the single entry handles all operands for the single instruction. The execution reservation station may issue a complete instruction at a time, including the operands for the instruction when the operands for the instruction are ready, for execution—depending on whether the instruction is a load/store instruction or an arithmetic instruction—by the arithmetic logic unit (ALU) (212) or to a load/store slice (222a, 222b, 222c) via the results bus (220). For example, the execution reservation station may determine that data for all operands is available, and in response, the execution reservation station may issue the instruction to the arithmetic logic unit (212).

The arithmetic logic unit (212) depicted in the example of FIG. 2 may be composed of many components, such as add logic, multiply logic, floating point units, vector/scalar units, and so on. Once an arithmetic logic unit executes an operand, the result of the execution may be stored in the result buffer (214) or provided on the results bus (220) through a multiplexer (216).

The results bus (220) may be configured in a variety of manners and be of composed in a variety of sizes. In some instances, each execution slice may be configured to provide results on a single bus line of the results bus (220). In a similar manner, each load/store slice may be configured to provide results on a single bus line of the results bus (220). In such a configuration, a multi-slice processor with four processor slices may have a results bus with eight bus lines—four bus lines assigned to each of the four load/store slices and four bus lines assigned to each of the four execution slices. Each of the execution slices may be configured to snoop results on any of the bus lines of the results bus. In some embodiments, any instruction may be dispatched to a particular execution unit and then be issued to any other slice for performance benefits. Further, an instruction may also be executed by a different execution slice than the execution slice from which the instruction is issued. As such, any of the execution slices may be coupled to all of the bus lines to receive results from any other slice. Further, each load/store slice may be coupled to each bus line in order to receive an issue load/store instruction from any of the execution slices. Readers of skill in the art will recognize that many different configurations of the results bus may be implemented.

The multi-slice processor in the example of FIG. 2 also includes a number of load/store slices (222a, 222b-222n). Each load/store slice includes a load/store access queue (LSAQ) (224), a multiplexer (MUX) (228), a data cache (232), and formatting logic (226), among other components described below with regard to FIG. 3. The load/store access queue (224) receives load and store operations to be carried out by the load/store slice (222). The formatting logic (226) formats data into a form that may be returned on the results bus (220) to an execution slice as a result of a load or store instruction. The multiplexer (228) may select an input in dependence upon data from the load/store access queue (224) or on receiving data from the results bus.

The example multi-slice processor of FIG. 2 may be configured for flush and recovery operations. A flush and recovery operation is an operation in which the registers (general purpose register and history buffer) of the multi-slice processor are effectively 'rolled back' to a previous state. The term 'restore' and 'recover' may be used, as context requires in this specification, as synonyms. Flush and recovery operations may be carried out for many reasons, including branch mispredictions, exceptions, and the like. Consider, as an example of a typical flush and recovery operation, that a dispatcher of the multi-slice processor dispatches over time and in the following order: an instruction A targeting logical register 5, an instruction-Btargeting logical register 5, and an instruction C targeting logical register 5. At the time instruction A is dispatched, the instruction parameters are stored in the general purpose register entry for logical register 5. Then, when instruction B is dispatched, instruction A is evicted to the history buffer (all instruction parameters are copied to the history buffer, including the logical register and the identification of instruction B as the evictor of instruction A), and the parameters of instruction B are stored in the general purpose register entry for logical register 5. When instruction C is dispatched, instruction B is evicted to the history buffer and the parameters of instruction C are stored in the general purpose register entry for logical register 5. Consider, now, that a flush and recovery operation of the registers is issued in which the dispatch issues a flush identifier matching the identifier of instruction C. In such an example, flush and recovery includes discarding the parameters of instruction C in the general purpose register entry for logical register 5 and moving the parameters of instruction B from the history buffer for instruction B back into the entry of general purpose register for logical register 5. In other words, in this example, instruction B is moved back into the entry of the general purpose register for logical register 5 instead of instruction A because instruction B was not flushed. However, in this example, if instruction C and instruction B been flushed, then instruction A would have been selected to be moved back to the history buffer.

During the flush and recovery operation, in prior art processors, the dispatcher was configured to halt dispatch of new instructions to an execution slice. Such instructions may be considered either target or source instructions. A target instruction is an instruction that targets a logical register for storage of result data. A source instruction by contrast has, as its source, a logical register. A target instruction, when executed, will result in data stored in an entry of a register file while a source instruction utilizes such data as a source for executing the instruction. A source instruction, while utilizing one or more logical registers as its source, may also target another one or more logical registers for storage of the results of instruction. That is, with respect to one logical register, an instruction may be considered a source instruction and with respect to another logical register, the same instruction may be considered a target instruction.

The multi-slice processor in the example of FIG. 2 also includes an instruction sequencing unit (240). While depicted within individual execution slices, in some cases, the instruction sequencing unit may be implemented independently of the execution slices or implemented within dispatch network (202). Instruction sequencing unit (240) may take dispatched instructions and check dependencies of the instructions to determine whether all older instructions with respect to a current instruction have delivered, or may predictably soon deliver, results of these older instructions from which the current instruction is dependent so that the current instruction may execute correctly. If all dependencies to a current instruction are satisfied, then a current instruction may be determined to be ready to issue, and may consequently be issued—regardless of a program order of instructions, where a program order may be determined by an instruction tag ('ITAG'). Such issuance of instructions may be referred to as an "out-of-order" execution, and the multi-slice processor may be considered an out-of-order machine.

In some cases, a load/store unit receiving an issued instruction, such as a load/store slice, may not yet be able to handle the instruction, and the instruction sequencing unit (240) may keep the instruction queued until such time as the load/store slice may handle the instruction. After the instruction is issued, the instruction sequencing unit (240) may track progress of the instruction based at least in part on signals received from a load/store slice.

Figure 3:
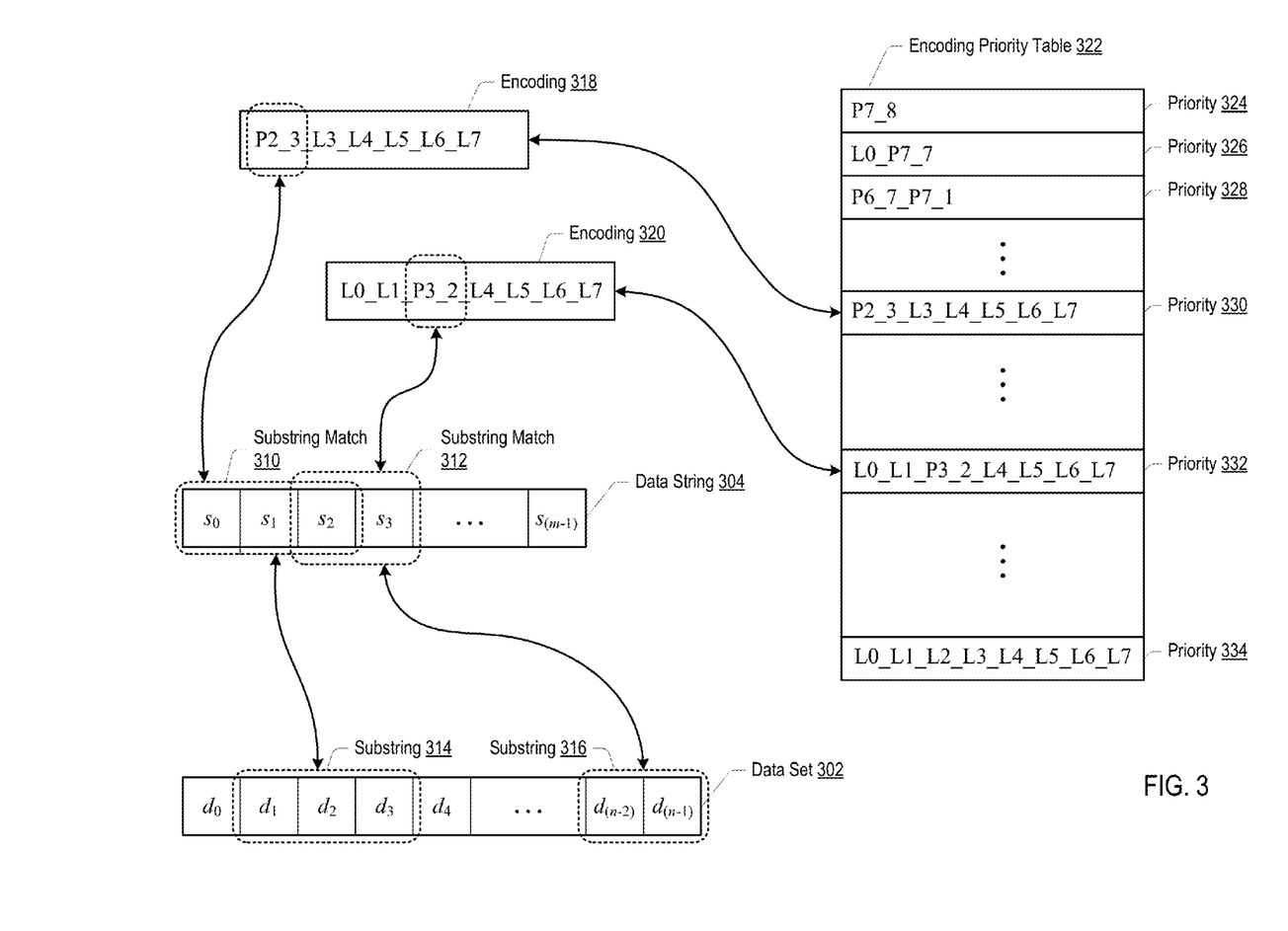
FIG. 3 sets forth a block diagram depicting an example data set, data string, encodings of substrings of the data string, and an encoding priority table used by a data encoder implementation of priority encodings of data pattern matches according to different embodiments.

For further explanation, FIG. 3 sets forth a block diagram depicting an example data set, data string, encodings of substrings of the data string, and an encoding priority table used by a data encoder (157) implementation of priority encodings of data pattern matches.

Data encoder (157) may encode a data set (also referred to as compressing the data set) by replacing one or more substrings of the data set with one or more encodings that combine indications of literal, or constant, values, with references to sub strings of data within the data set. To decode an encoded data set (also referred to as decompressing the data set), the encoded references to sub strings of data may be interpreted and replaced by the referenced sub strings in the data set. Further, the data encoder (157) may select a particular encoding in dependence upon a priority list of encodings, where the priority list is sorted, or ranked, according to a measure of a reduced amount of size of the particular encoding with respect to the original, literal data values.

In this example, the computer (152) may be receiving a stream of data that is part of a data set, such as data set (302). However, in other examples, the computer (152) may access an entire, stored data set and process the data set incrementally by analyzing chunks or portions of the data set at a time. Data set (302) may include a plurality of bytes, depicted as a set of n bytes $\{d_0, d_1 \ldots d_{(n-1)}\}$, where then bytes are contiguous. In other examples, instead of bytes of data, the data set (302) may include any number of component units of data, $d_i$ where a size of $d_i$ may be any number of bits.

Data string (304) may be, in the case of receiving a data stream of the data set (302) to encode, received data to be added to the data set (302). In another example, in encoding a data set, if the data set (302) is stored data, the data string (304) may be a portion of data being read and processed at a time. In this example, the data string (304) includes a plurality of bytes, depicted as a set of m bytes $\{s_0, s_1, s_2, s_3 \ldots s_{(m-1)}\}$, where the m bytes are contiguous, and where m may be any number, such as eight (8). Further, each byte of data in the data string (304) may represent any type of data.

An encoding of a data string may include references, or pointers, to a location within a data set, one or more literal values, or a combination of references and literal values that may be interpreted to generate the original data of the data string. Further, a single data string may be encoded into multiple different encodings that may each equally be interpreted to generate the original data string.

For example, data string (304) includes a substring (310) that includes $\{s_0, s_1, s_2\}$, and data string (304) also includes a substring (312) that includes $\{s_2, s_3\}$. Further, substring (310) of the data string (304) matches substring (314) of the data set (302), and substring (312) of the substring (304) matches substring (316) of the data set (302). In other words, substring (310) represented by $\{s_0, s_1, s_2\}$, matches substring (314), represented by $\{d_1, d_2, d_3\}$, because $s_0$ is equal to $d_1$, $s_1$ is equal to $d_2$, and $s_2$ is equal to $d_3$. Similarly, substring (312) represented by $\{s_2, s_3\}$, matches substring (316), represented by $\{d_{(n-2)}, d_{(n-1)}\}$, because $s_2$ is equal to $d_{(n-2)}$ and $s_3$ is equal to $d_{(n-1)}$.

Due to data string (304) having more than one substring that matches into the data set (302), there is more than one encoding for data string (304). Further, in general, depending on a size of the data string, there may encodings that include any combination of references to sub strings of different sizes and literal values. In this example, two encodings of data string (304) are depicted, encoding (318) and encoding (320)—however, in general, encodings that result in some measure of compression, or reduction in size, may be considered. While data string (304) may also be encoded as a representation including only literal values, which would simply be the original data string, for simplicity, this encoding is not considered.

In other words, the data encoder (157) may evaluate the data string (304) to determine every possible encoding for every possible combination of references and literal values—where a reference references sequential, or adjacent, literal values. In other words, for an eight (8) byte data string, one possible encoding may include: a single literal value at byte 0, and a reference to a seven byte substring for bytes 1-7; a single literal values at byte 0, a single literal value at byte 1, and a reference to a six byte substring for bytes 2-7; a single byte literal at byte 0, a reference to a six byte substring for bytes 2-6, and a single literal at byte 7; and so on for every combination of literal value and substring of length two or more.

Data string (304), which includes a three-byte substring match, depicted as substring (310), may be included in encoding (318) ("P2_3_L3_L4_L5_L6_L7")—where the encoding may be decoded by interpreting "LX" as indicating that the byte at position X of a data string is a literal value, and by interpreting "PY_Z" as indicating that a matching string ends at byte Y and is Z bytes long. In this example, "P2_3_L3_L4_L5_L6_L7" may be decoded to indicate that bytes 0-2 have been replaced by a reference to a string in the data set that is three bytes long and ends at byte position 2, byte 3 is a literal value, byte 4 is a literal value, byte 5 is a literal value, byte 6 is a literal value, and byte 7 is a literal value.

Similarly, data string (304), which further includes a two-byte substring match, depicted as substring (312), may be included in encoding (320) ("L0_L1_P3_2_L4_L5_L6_L7"). In this example, "L0_L1_P3_2_L4_L5_L6_L7" may be decoded to indicate that byte 0 is a literal value, byte 1 is a literal value, and bytes 2 and 3 have been replaced by a reference to a string in the data set that is two bytes long and ends at byte position 3, byte 4 is a literal value, byte 5 is a literal value, byte 6 is a literal value, and byte 7 is a literal value.

Encoding priority table (322) may include a list of encodings ordered according to a determined priority value, where a particular priority value for a particular encoding may be calculated to represent a measure of reduction in size if the encoding is used instead of an original data string being encoded. For example, encoding priority table (322) may include priorities (324-334), where priority (334), corresponding to encoding "L0_L1_L2_L3_L4_L5_L6_L7", is a lowest priority encoding value, and priority (324), corresponding to encoding "P7_8", is a highest priority encoding value.

In other words, if a data string encoding includes only literal values, then no reduction in size would be gained by an encoding corresponding to "L0_L1_L2_L3_L4_L5_L6_L7", and if a data string encoding, corresponding to "P7_8", includes a single reference, or pointer, to a string in the data set, then the greatest savings in size is achieved since an m byte string is entirely replaced by the pointer to the string in the data set. A pointer typically uses a fewer number of bits than a literal therefore resulting in data compression. A very long string may be encoded by a single pointer therefore achieving higher amount of compression. Similarly, each encoding in the encoding priority table (322) is ordered according to a calculated priority value.

In this example, since encoding (318), corresponding to priority (330) value, has a higher priority value than encoding (320), corresponding to priority (332) value, the data encoder (157) would select encoding (318) to represent the data string (304). In this way, a data set may be encoded such that the encoded data set is reduced in size.

Figure 4:
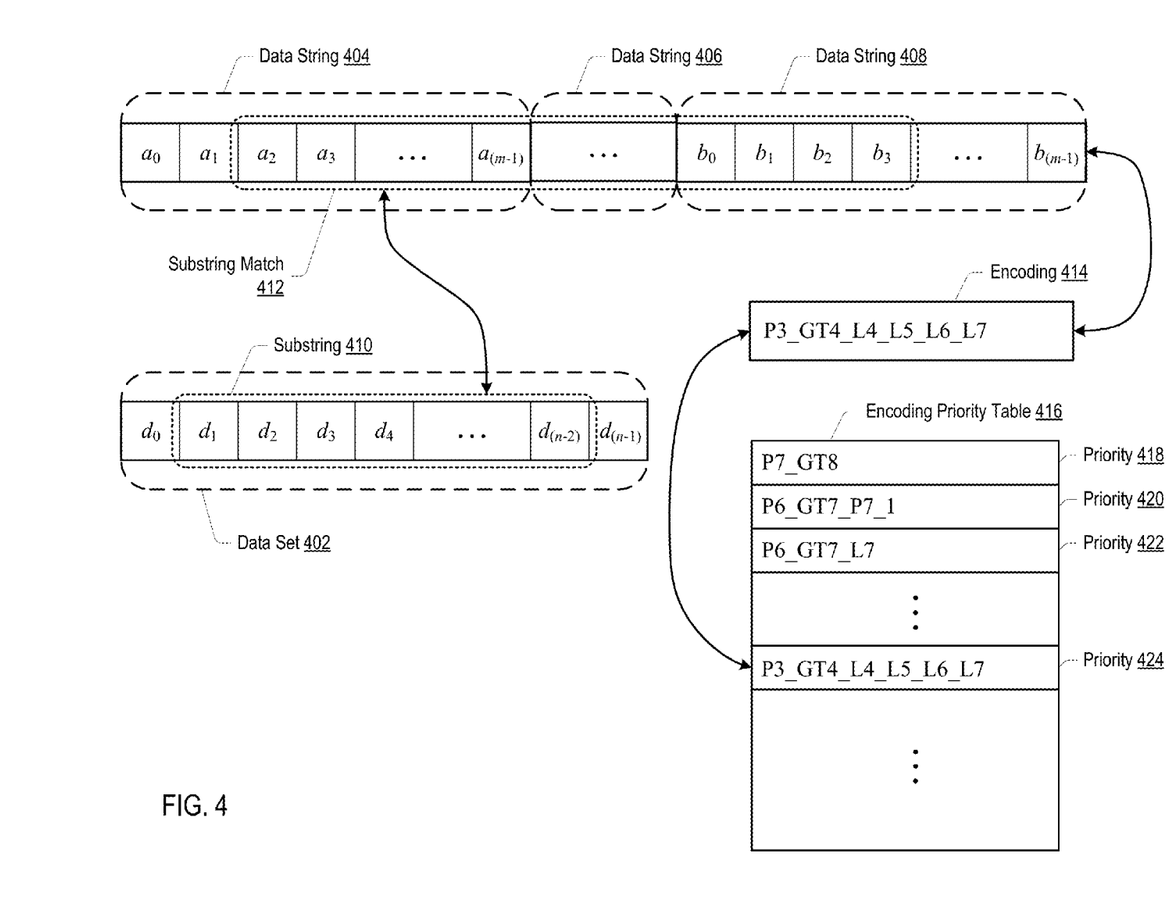
FIG. 4 sets forth a block diagram depicting an example data set, data string, encodings of sub strings of the data string, and an encoding priority table used by a data encoder implementation of priority encodings of data pattern matches according to different embodiments.

For further explanation, FIG. 4 sets forth a block diagram depicting an example data set, data strings, and a priority encoding table corresponding to a continuing match encoding used by a data encoder (157) implementation of priority encodings of data pattern matches. In the example described above with regard to FIG. 3, each data string corresponds to a single encoding. By contrast, in FIG. 4, a continuing string match across multiple data strings may be encoded into a single encoding.

In this example, instead of analyzing each single data string to determine a single encoding, if a substring of a data string includes the last byte of the data string, the data encoder (157) continues processing of an additional data strings until the string match ends—and responsive to the string match ending, the data encoder (157) may generate an encoding that encompasses the multiple data strings across which the string match spanned. For example, for data set (402) the data encoder (157) examines the possibility that the substring $\{a_2, a_3 \ldots a_{(m-1)}\}$ continues into the next one or more data strings (406-408). For example, the substring $\{a_2, a_3 \ldots a_{(m-1)}\}$ (412), which began in data string (404), continues across one or more data strings (406) and ends in data string (408), and includes contiguous literal values $\{a_2, a_3 \ldots b_2, b_3\}$. In this way, if a substring spans across multiple data strings, the substring may be encoded by a single encoding.

Further, in this example, there may be multiple priority tables, where a particular priority table, such as encoding priority table (416) storing priority values (418-424), may be selected in dependence upon how many data strings are spanned for the encoding—where the count of data string spanned may be used in encoding and decoding. For example, in some cases, there may be a priority table corresponding to a number of data strings across which a string match spanned.

In other words, a first priority encoding table may be used for string matches that span one (1) data strings, a second priority encoding table may be used for string matches that span two (2) data strings, and so on. In other examples, a single priority encoding table may be mapped to a range of counts across which a string match spans. In other words, a first priority encoding table may be used for string matches that span one (1), two (2), or three (3) data strings, a second priority encoding table may be specified for string matches that span four (4) and five (5) data strings, and so on.

In this example, to encode a string that spans multiple data strings, an encoding of "PY_GTX" may be specified to indicate that a string match is continued from a previous data string, and includes X bytes of the previous data string and continues into the byte position of the last data string ending at position Y. Further, a continuation count may be incremented each time a match continues onto a next data string, where the continuation count may be used to distinguish encodings, and where the continuation count may be used to select an encoding priority table.

As depicted in FIG. 4, a data set (402) includes substring (410), which includes $\{d_1, d_2 \ldots d_{(n-2)}\}$, and the substring (410) matches substring match (412) across data strings (404-408), which may be an arbitrary number of data strings. Further, if m is eight (8), the encoding (414) is generated to indicate literal values $a_0$ and $a_1$ of data string (404), a reference to the substring (410), and literal values $b_4$, $b_5$, $b_6$, and $b_7$ of data string (408)—where this encoding is depicted as encoding (414) ("P3_GT4_L4_L5_L6_L7"), and where a continuation count indicates a number of data strings across which the string ending at "GT4" matches. In other words, the string match from the previous data string continues for four (4) bytes into the last data string (408), and includes $\{b_0, b_1, b_2, b_3\}$. In this way, an encoding may represent data across any number of data strings.

Similar to the example described above with regard to FIG. 3, the encoding (414) may be one of multiple possible encodings, and each generated encoding may be used to index into a correspondingly mapped encoding priority table to determine a respective priority value for each respective encoding.

Further, the greater the continuation count corresponding to a particular encoding priority table, the higher the priority values in the table may be—indicating a preference for encoding with matching strings spanning a greatest amount of data strings, which would correspond to a greatest amount of size reduction in an encoding of the data set.

Figure 5:
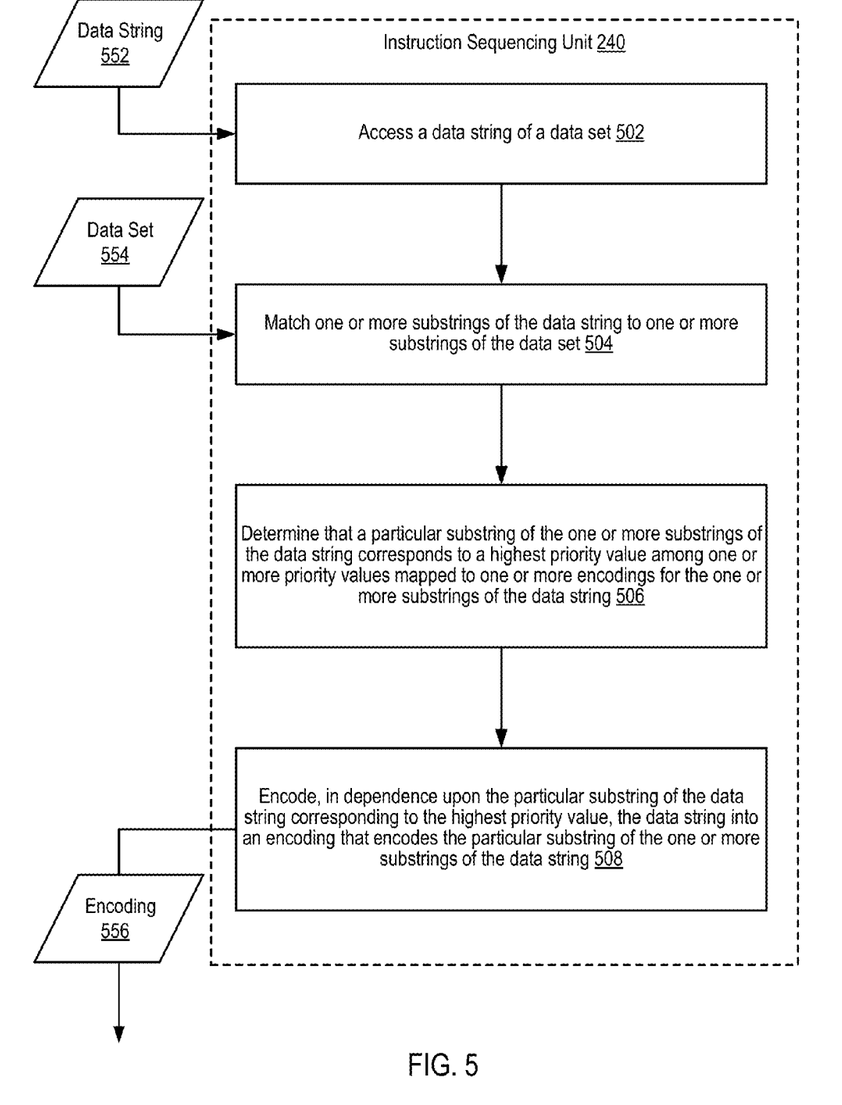
FIG. 5 sets forth a flow chart illustrating an exemplary method of implementing priority encoding of data pattern matches according to different embodiments.

For further explanation, FIG. 5 sets forth a flow chart illustrating an exemplary method of implementing priority encoding of data pattern matches. The method of FIG. 5 may be carried out by a multi-slice processor similar to that in the examples of FIGS. 1-4. Such a multi-slice processor may include a data encoder (157), as described above with regard to FIGS. 1-4.

The method of FIG. 5 includes accessing (502) a data string (552) of a data set (554). Accessing (502) the data string (552) of the data set (554) may be carried out by the data encoder (157) either receiving a transmitted data stream over a network, receiving data from another application, or reading a stored data set within a storage device. In some cases, the data string may be different sized portions, or a different sized subset, of the entire data set.

The method of FIG. 5 also includes matching (504) one or more substrings of the data string (552) to one or more substrings of the data set. Matching (504) the one or more substrings of the data string may be carried out by identifying each possible substring of the data string, and for each identified substring, comparing a respective identified substring to each possible substring in the data set of equal size to the substring in the data string. For example, for a data string that is eight (8) bytes long, there are seven (7) substrings of contiguous bytes that are two (2) bytes long, six (6) substrings of contiguous bytes that are three (3) bytes long, and so on. While it may be possible that there are no matching substrings, in this example, one or more substrings of the data string are found to match respective one or more strings of the data set.

Further, in some cases, single, literal values of the data string are not compared since a reference to replace a matching, single literal value may occupy more space than the memory occupied by the literal value. However, in different examples, where a literal value may occupy more space than a pointer, or reference, to a matching literal value in the data set, single literal values may also be matched and replaced with references to matching literal values in the data set.

The method of FIG. 5 also determining (506) that a particular substring of the one or more substrings of the data string corresponds to a highest priority value among one or more priority values mapped to one or more encodings for the one or more substrings of the data string. Determining (506) that the particular substring of the one or more substrings of the data string corresponds to a highest priority value may be carried out by the data encoder (157) generating—in dependence upon the one or more matching substrings—each possible encoding of the data string. Further, for each possible encoding that is generated, an encoding priority table may be referenced and indexed according to a particular encoding to determine a particular priority value. An encoding priority table may be defined as described above with regard to FIGS. 3 and 4. Further, given priority values for each of the possible encodings, a particular encoding with a highest priority value may be determined.

The method of FIG. 5 also includes encoding (508), in dependence upon the particular substring of the data string corresponding to the highest priority value, the data string into an encoding that encodes the particular substring of the one or more substrings of the data string. Encoding (508) the data string may be carried out by the data encoder (157) selecting the particular encoding generated that corresponds with a highest priority value. As described above with regard to FIGS. 3 and 4, encoding the data string may include replacing substrings with codes that may be interpreted to determine a location, and size, of a string within a data set is to be replaced by a particular code. Further, the encoding may include an indication of literal values, or constant values, that are not decoded as references into the data set, but rather a literal value of the data string.

In this way, for each byte of a data string, an encoding may indicate whether a particular byte corresponds to a literal value, or whether multiple bytes of the data string correspond to a reference into a data set storing the values of a sub string. Further, each sub string in a data string that is replaced by a reference that occupies less space than the substring in an encoding results in an encoded data set that is that much smaller than the original data set.

Figure 6:
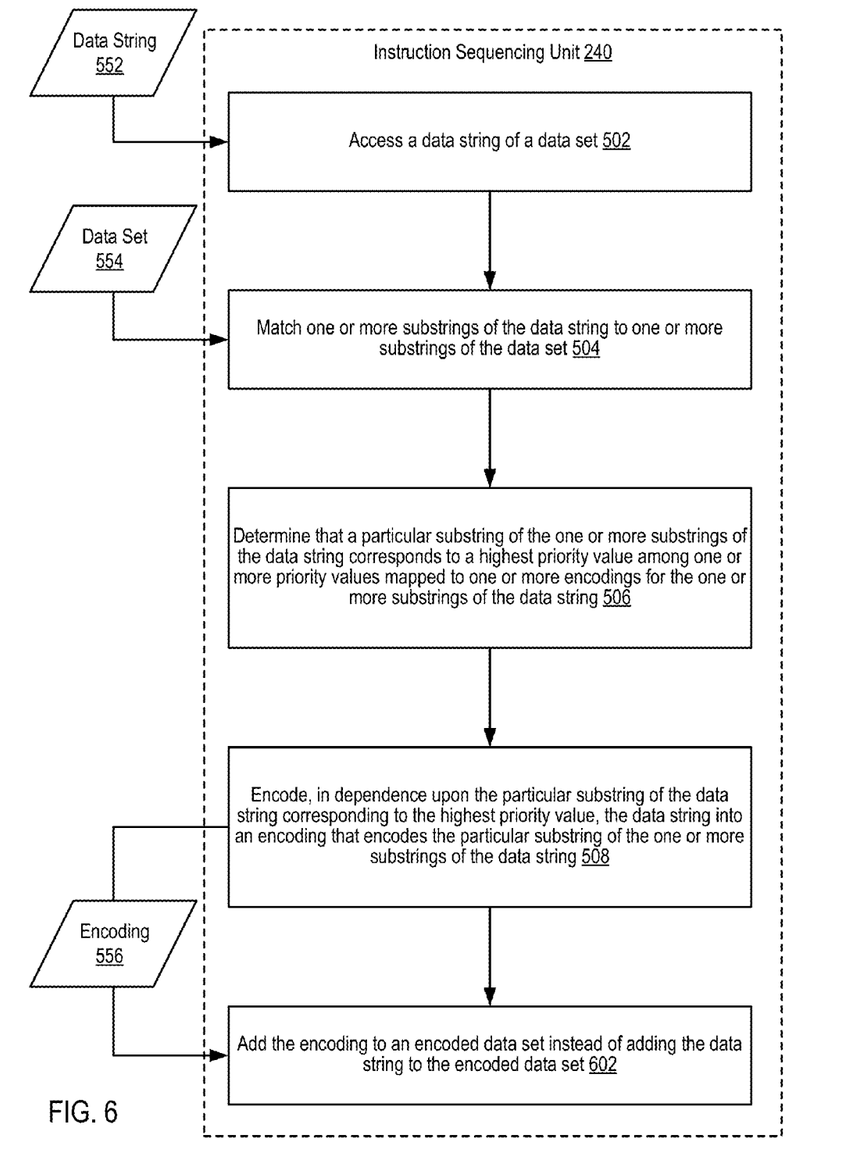
FIG. 6 sets forth a flow chart illustrating an exemplary method of implementing priority encoding of data pattern matches according to different embodiments.

For further explanation, FIG. 6 sets forth a flow chart illustrating an exemplary method of implementing priority encoding of data pattern matches. The method of FIG. 6 may be carried out by a multi-slice processor similar to that in the examples of FIGS. 1-4. Such a multi-slice processor may include a data encoder (157), as described above with regard to FIGS. 1-4.

The method of FIG. 6 is similar to the method of FIG. 5 in that the method of FIG. 6 also includes: accessing (502) a data string (552) of a data set (554); matching (504) one or more substrings of the data string (552) to one or more substrings of the data set (554); determining (506) that a particular substring of the one or more substrings of the data string corresponds to a highest priority value among one or more priority values mapped to one or more encodings for the one or more substrings of the data string; and encoding (508), in dependence upon the particular substring of the data string corresponding to the highest priority value, the data string into an encoding that encodes the particular substring of the one or more substrings of the data string.

The method of FIG. 6 differs from the method of FIG. 5, however, in that the method of FIG. 6 further includes adding (602) the encoding (556) to an encoded data set instead of adding the data string to the encoded data set. Adding (602) the encoding (556) to the encoded data set may be carried out by the data encoder (157) creating a file for the encoded data set and storing the encoding (556) in the encoded data set file instead of the original data string processed. Further, if the data set is streaming data, such as a transmission, the encoded file may be created incrementally as data strings are received. In the case of the data set being an entire, existing file, a new file for the encoded data set may be created, where the file is updated as data strings from the data set are accessed and processed.

Figure 7:
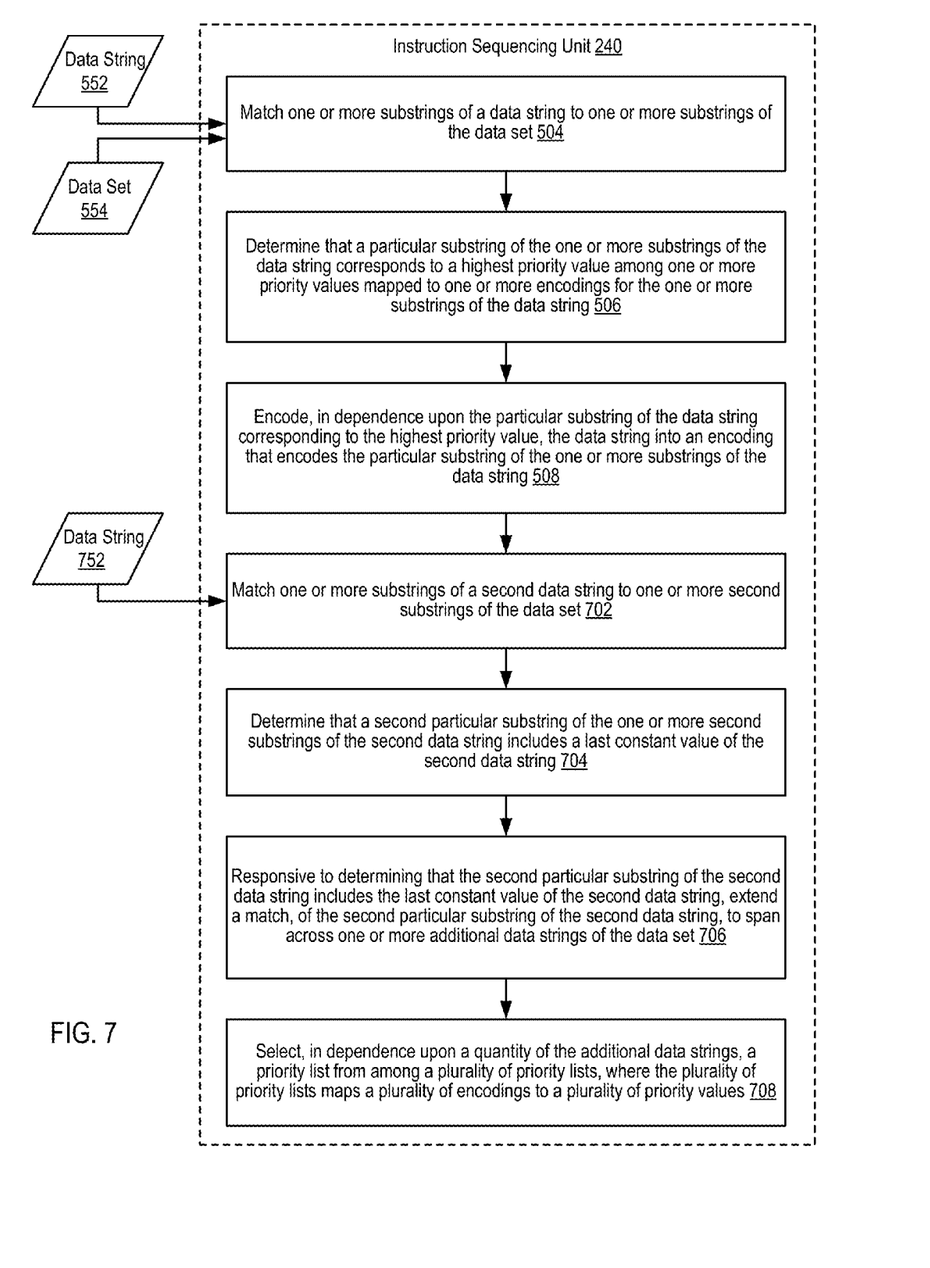
FIG. 7 sets forth a flow chart illustrating an exemplary method of implementing priority encoding of data pattern matches according to different embodiments.

For further explanation, FIG. 7 sets forth a flow chart illustrating an exemplary method of implementing priority encoding of data pattern matches. The method of FIG. 7 may be carried out by a multi-slice processor similar to that in the examples of FIGS. 1-4. Such a multi-slice processor may include a data encoder (157), as described above with regard to FIGS. 1-4.

The method of FIG. 7 is similar to the method of FIG. 5 in that the method of FIG. 7 also includes: matching (504) one or more substrings of a data string (552) to one or more substrings of the data set (554); determining (506) that a particular substring of the one or more substrings of the data string corresponds to a highest priority value among one or more priority values mapped to one or more encodings for the one or more substrings of the data string; and encoding (508), in dependence upon the particular substring of the data string corresponding to the highest priority value, the data string into an encoding that encodes the particular substring of the one or more substrings of the data string.

The method of FIG. 7 differs from the method of FIG. 5, however, in that the method of FIG. 7 further includes matching (702) one or more substrings of a second data string (752) to one or more second substrings of the data set (554); determining (704) that a second particular substring of the one or more substrings of the second data string (752) includes a last constant value of the second data string (752); responsive to determining that the second particular substring of the second data string (752) includes the last constant value of the second data string (752), extending (706) a match, of the second particular substring of the second data string (752), to span across one or more additional data strings of the data set (554); and selecting (708), in dependence upon a quantity of the additional data strings, a priority list from among a plurality of priority lists, where the plurality of priority lists maps a plurality of encodings to a plurality of priority values.

Matching (702) the one or more substrings of the second data string (752) to one or more second substrings of the data set (554) may be carried out by the data encoder (157) similarly to matching (504) the one or more substrings of the data string (552) to the one or more substrings in the data set (554).

Determining (704) that a second particular substring of the one or more second substrings of the second data string (752) includes a last constant value, or literal value, of the second data string (752) may be carried out by the data encoder (157) determining—for each of the one or more second substrings of the second data string—whether or not the literal values of a particular substring is located at the last position of the second data string. Further, if a literal value of a substring does include the last position of the second data string, then the data encoder (157) may delay generating an encoding to include in an encoded data set until an end of the sub string is determined. Otherwise, if none of the one or more second substrings include the last literal value of the second data string, then the data encoder (157) may generate an encoding of the second data string to be included in the encoded data set.

Extending (706) a match—of the second particular substring of the second data string (752)—to span across one or more additional data strings of the data set may be carried out by the data encoder (157) repeating the matching (504) process to find string matches that include a string that includes the second particular data string in addition with one or more literal values of the beginning of an additional data string. Further, if a match extends to include all of the literal values of an additional data string, then the matching (504) process is continued over additional data strings until the end of a matching, extended string is found.

Selecting (708), in dependence upon a quantity of the additional data strings, a priority list from among a plurality of priority lists may be carried out by the data encoder (157) maintaining a counter that is incremented each time a match is extended across another data string. Further, at the end of a matching string, the counter value may be used to select a corresponding priority list. For example, as described above with regard to FIG. 4, ranges of counter values may be mapped to different priority lists—where a counter value of 1-3 may map to a first priority list, a counter value of 4-8 may map to a second priority list, and so on. However, in other cases, a priority list may be defined for each counter value, where a counter value of one (1) may map to a first priority list, a counter value of two (2) may map to a second priority list, and so on.

In this way, for a string match that extends across multiple data strings, a priority list may be used to select an encoding that includes the extended string match. Further, an advantage of using an encoding that includes an extended string match instead of a sequence of encodings of individual data strings is a greater amount of data compression.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
   matching one or more sub strings of a data string to one or more sub strings of a data set;
   determining that a particular substring of the one or more substrings of the data string corresponds to a highest priority value among one or more priority values mapped to one or more encodings for the one or more substrings of the data string; and
   encoding, in dependence upon the particular substring of the data string corresponding to the highest priority value, the data string into an encoding that encodes the particular substring of the one or more substrings of the data string.

2. The method of claim 1, further comprising:
   adding the encoding to an encoded data set instead of adding the data string to the encoded data set.

3. The method of claim 2, wherein the data string is a second data string, wherein the particular substring is a first particular substring, and wherein the method further comprises:
   matching one or more substrings of the second data string to one or more second substrings of the data set;
   determining that a second particular substring of the second data string includes a last constant value of the second data string; and
   responsive to determining that the second particular substring of the second data string includes the last constant value of the second data string, extending a match, of the second particular substring of the second data string, to span across one or more additional data strings of the data set.

4. The method of claim 3, further comprising:
   selecting, in dependence upon a quantity of the additional data strings, a priority list from among a plurality of priority lists, wherein the plurality of priority lists maps a plurality of encodings to a plurality of priority values.

5. The method of claim 4, wherein each priority list of the plurality of priority lists corresponds to a range of quantities of additional data strings, and wherein selecting the priority list is in dependence upon the quantity of additional data strings being within a range corresponding to a particular priority list of the plurality of priority lists.

6. The method of claim 1, wherein the particular substring is a longest matching substring in the data set, and wherein the encoding encodes a plurality of substrings of the data string, wherein the plurality of sub strings of the data string include the particular substring.

7. The method of claim 6, wherein the highest priority value corresponds to a ranking within a priority list, wherein the priority list maps respective encodings to respective priority values, and wherein respective priority values of the priority values corresponds to a respective compression metric for a respective encoding.

8. A computer processor comprising:
   a data encoder configured to carry out:
   matching one or more sub strings of a data string to one or more sub strings of a data set;
   determining that a particular substring of the one or more substrings of the data string corresponds to a highest priority value among one or more priority values mapped to one or more encodings for the one or more substrings of the data string; and
   encoding, in dependence upon the particular sub string of the data string corresponding to the highest priority value, the data string into an encoding that encodes the particular substring of the one or more substrings of the data string.

9. The computer processor of claim 8, wherein the data encoder is further configured to carry out:
   adding the encoding to an encoded data set instead of adding the data string to the encoded data set.

10. The computer processor of claim 9, wherein the data string is a second data string, wherein the particular substring is a first particular substring, and wherein the data encoder is further configured to carry out:
    matching one or more substrings of the second data string to one or more second substrings of the data set;
    determining that a second particular substring of the second data string includes a last constant value of the second data string; and
    responsive to determining that the second particular substring of the second data string includes the last constant value of the second data string, extending a match, of the second particular substring of the second data string, to span across one or more additional data strings of the data set.

11. The computer processor of claim 8, wherein the data encoder is further configured to carry out:
    selecting, in dependence upon a quantity of the additional data strings, a priority list from among a plurality of priority lists, wherein the plurality of priority lists maps a plurality of encodings to a plurality of priority values.

12. The computer processor of claim 11, wherein each priority list of the plurality of priority lists corresponds to a range of quantities of additional data strings, and wherein selecting the priority list is in dependence upon the quantity of additional data strings being within a range corresponding to a particular priority list of the plurality of priority lists.

13. The computer processor of claim 8, wherein the particular substring is a longest matching substring in the data set, and wherein the encoding encodes a plurality of substrings of the data string, wherein the plurality of substrings of the data string include the particular substring.

14. The computer processor of claim 13, wherein the highest priority value corresponds to a ranking within a priority list, wherein the priority list maps respective encodings to respective priority values, and wherein respective priority values of the priority values corresponds to a respective compression metric for a respective encoding.

15. An apparatus comprising:
  a data encoder configured to carry out:
    matching one or more sub strings of a data string to one or more sub strings of a data set;
    determining that a particular substring of the one or more substrings of the data string corresponds to a highest priority value among one or more priority values mapped to one or more encodings for the one or more substrings of the data string; and
    encoding, in dependence upon the particular sub string of the data string corresponding to the highest priority value, the data string into an encoding that encodes the particular substring of the one or more substrings of the data string.

16. The apparatus of claim 15, wherein the data encoder is further configured to carry out:
  adding the encoding to an encoded data set instead of adding the data string to the encoded data set.

17. The apparatus of claim 15, wherein the data string is a second data string, wherein the particular substring is a first particular substring, and wherein the data encoder is further configured to carry out:
  matching one or more substrings of the second data string to one or more second substrings of the data set;
  determining that a second particular substring of the second data string includes a last constant value of the second data string; and
  responsive to determining that the second particular substring of the second data string includes the last constant value of the second data string, extending a match, of the second particular substring of the second data string, to span across one or more additional data strings of the data set.

18. The apparatus of claim 15, wherein the data encoder is further configured to carry out:
  selecting, in dependence upon a quantity of the additional data strings, a priority list from among a plurality of priority lists, wherein the plurality of priority lists maps a plurality of encodings to a plurality of priority values.

19. The apparatus of claim 18, wherein each priority list of the plurality of priority lists corresponds to a range of quantities of additional data strings, and wherein selecting the priority list is in dependence upon the quantity of additional data strings being within a range corresponding to a particular priority list of the plurality of priority lists.

20. The apparatus of claim 15, wherein the particular substring is a longest matching substring in the data set, and wherein the encoding encodes a plurality of substrings of the data string, wherein the plurality of substrings of the data string include the particular substring.

* * * * *